(12) United States Patent
Hao et al.

(10) Patent No.: US 11,211,012 B2
(45) Date of Patent: Dec. 28, 2021

(54) DISPLAY PANEL AND MANUFACTURING METHOD THEREOF, AND DISPLAY DEVICE

(71) Applicants: BEIJING BOE TECHNOLOGY DEVELOPMENT CO., LTD., Beijing (CN); BOE TECHNOLOGY GROUP CO., LTD., Beijing (CN)

(72) Inventors: Xueguang Hao, Beijing (CN); Xinyin Wu, Beijing (CN); Yong Qiao, Beijing (CN)

(73) Assignees: BEIJING BOE TECHNOLOGY DEVELOPMENT CO., LTD., Beijing (CN); BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 17/040,340

(22) PCT Filed: Apr. 20, 2020

(86) PCT No.: PCT/CN2020/085628
§ 371 (c)(1),
(2) Date: Sep. 22, 2020

(87) PCT Pub. No.: WO2020/259030
PCT Pub. Date: Dec. 30, 2020

(65) Prior Publication Data
US 2021/0043147 A1  Feb. 11, 2021

(30) Foreign Application Priority Data

Jun. 26, 2019 (CN) .......................... 201920973397.0

(51) Int. Cl.
G09G 3/3266 (2016.01)
G09G 3/3275 (2016.01)
H01L 27/32 (2006.01)

(52) U.S. Cl.
CPC ......... *G09G 3/3266* (2013.01); *G09G 3/3275* (2013.01); *H01L 27/3223* (2013.01);
(Continued)

(58) Field of Classification Search
None
See application file for complete search history.

(56) References Cited

U.S. PATENT DOCUMENTS

2009/0102824 A1\* 4/2009 Tanaka ................. G09G 3/3648
345/205
2014/0139771 A1  5/2014 Choi
(Continued)

FOREIGN PATENT DOCUMENTS

CN  103823314 A  5/2014
CN  108508968 A  9/2018
(Continued)

*Primary Examiner* — Aneeta Yodichkas
(74) *Attorney, Agent, or Firm* — Dilworth & Barrese, LLP.; Michael J. Musella, Esq.

(57) ABSTRACT

A display panel, a manufacturing method thereof and a display device are disclosed. The display panel includes: a display region including at least one rounded corner; and a non-display region located at a periphery of the display region. The non-display region includes: a gate drive circuit; and a plurality of first dummy pixels located outside the at least one rounded corner of the display region, a first power line of each of the plurality of first dummy pixels being connected with a signal line of the gate drive circuit.

19 Claims, 12 Drawing Sheets

(52) U.S. Cl.
CPC . *H01L 27/3288* (2013.01); *G09G 2300/0413* (2013.01); *H01L 2227/323* (2013.01)

(56)     References Cited

U.S. PATENT DOCUMENTS

2016/0190166 A1*  6/2016  Kim ................... G09G 3/3233
                                                                257/71
2018/0247582 A1   8/2018  Park et al.

FOREIGN PATENT DOCUMENTS

| CN | 209691758 U  | 11/2019 |
| WO | 2018038814 A1 | 1/2018 |

* cited by examiner

DISPLAY PANEL AND MANUFACTURING METHOD THEREOF, AND DISPLAY DEVICE

CROSS REFERENCE TO RELATED APPLICATIONS

This application claims the benefit of Chinese Patent Application No. 201920973397.0 filed on Jun. 26, 2019, entitled "DISPLAY PANEL AND DISPLAY DEVICE", for any purposes, the entire disclosure of which is incorporated by reference herein.

TECHNICAL FIELD

At least one embodiment of the present disclosure relates to a display panel and a manufacturing method thereof, and a display device.

BACKGROUND

Organic light-emitting diode (OLED) is widely used in various electronic products. For example, an OLED display panel adopts a rectangular screen, and the OLED display panel generally adopts a gate on array (GOA) circuit.

SUMMARY

Embodiments of the present disclosure provide a display panel, a manufacturing method thereof and a display device.

According to first aspect of the present disclose, it is provided a display panel, comprising:

a display region, comprising at least one rounded corner; and a non-display region, located at a periphery of the display region, and the non-display region comprising:

a gate drive circuit; and a plurality of first dummy pixels, located outside the at least one rounded corner of the display region, a first power line of each of the plurality of the first dummy pixels being connected with a high-level signal line of the gate drive circuit.

For example, each of the plurality of the first dummy pixels is located between the gate drive circuit and the display region, and each of the plurality of the first dummy pixels is configured to not emit light.

For example, the plurality of the first dummy pixels are arranged as a step shape.

For example, the plurality of the first dummy pixels comprise at least one column in a first direction and at least one row in a second direction, and the first direction and the second direction are perpendicular to each other.

For example, the display panel further comprises: a bonding region, wherein the bonding region is located at one of sides of the display region, a plurality of second dummy pixels are provided at an opposite side of the display region to the bonding region, and each of the plurality of the second dummy pixels is configured not to emit light.

For example, a second power line of each of the plurality of the second dummy pixels is connected with the high-level signal line of the gate drive circuit.

For example, the plurality of the second dummy pixels are arranged at equal intervals in at least one direction selected from the group consisting of a first direction and a second direction, and the first direction and the second direction are perpendicular to each other.

For example, the plurality of the second dummy pixels comprise at least one column in the first direction and at least one row in the second direction.

For example, the display panel comprises: a first rounded corner and a second rounded corner which are proximal to the bonding region, and the plurality of the first dummy pixels are arranged outside the first rounded corner and outside the second rounded corner.

For example, the display panel comprises: a third rounded corner and a fourth rounded corner which are distal to the bonding region, and the plurality of the first dummy pixels are arranged outside the third rounded corner and outside the fourth rounded corner.

For example, each of the plurality of the first dummy pixels and each of the plurality of the second dummy pixels respectively at least comprises a pixel drive circuit, the pixel drive circuit comprises a first scanning line, a second scanning line, and a third scanning line, and the first scanning line, the second scanning line, and the third scanning line are connected with the gate drive circuit respectively, or the first scanning line, the second scanning line, and the third scanning line are in a suspended state.

For example, each of the plurality of the first dummy pixels and each of the plurality of the second dummy pixels respectively further comprises a light-emitting unit, the pixel drive circuit comprises a drive transistor, the drive transistor comprises a drain electrode, and the light-emitting unit comprises an anode and does not comprise a light-emitting layer, the drain electrode of the drive transistor is electrically connected with the anode of the light-emitting unit.

For example, each of the plurality of the first dummy pixels and each of the plurality of the second dummy pixels respectively further comprises a light-emitting unit, the pixel drive circuit comprises a drive transistor, the drive transistor comprises a drain electrode, and the light-emitting unit comprises an anode, a light-emitting layer, and a cathode, and the drain electrode of the drive transistor is electrically isolated from the anode of the light-emitting unit.

For example, each of the plurality of the first dummy pixels and each of the plurality of the second dummy pixels respectively further comprises:

a base substrate;

a buffer layer, provided on the base substrate;

an active layer, provided on the buffer layer;

a first insulation layer, overlaying the active layer;

a first scanning line, a second scanning line, a third scanning line, and a first gate electrode, all of which being provided in a same layer, the first scanning line, the second scanning line, the third scanning line, and the first gate electrode being provided on the first insulation layer;

a second insulation layer, overlaying the first scanning line, the second scanning line, the third scanning line, and the first gate electrode;

an initial voltage line and a second gate electrode, both of which being provided in a same layer, the initial voltage line and the second gate electrode are provided on the second insulation layer;

a third insulation layer, overlaying the initial voltage line and the second gate electrode, wherein the third insulation layer is provided with a plurality of via holes, and the plurality of via holes comprise a first via hole, a second via hole, a third via hole, a fourth via hole, a fifth via hole, a sixth via hole, and a seventh via hole; each of the first via hole, the second via hole, and the third via hole exposes the second gate electrode; each of the fifth via hole and the sixth via hole exposes the active layer; and the seventh via hole exposes the initial voltage line;

a data line, a power line, a connecting line, and the drain electrode, all of which are provided in a same layer, wherein the data line, the power line, the connecting line, the drain electrode are provided on the third insulation layer; one terminal of the drain electrode is connected with the second gate electrode through the first via hole, the other terminal of the drain electrode is connected with the active layer through the fifth via hole; the data line is connected with the active layer through the fourth via hole; the power line is connected with the second gate electrode through the second via hole and the third via hole; one terminal of the connecting line is connected with the active layer through the sixth via hole, and the other terminal of the connecting line is connected with the initial voltage line through the seventh via hole;

a fourth insulation layer, overlaying the data line, the power line, the connecting line, and the drain electrode, the fourth insulation layer being provided with an eighth via hole, the eighth via hole exposing the drain electrode;

a pixel defining layer, provided on the fourth insulation layer and defining a pixel opening, the eighth via hole being located in the pixel opening; and the anode, provided in the pixel opening and connected with the drain electrode through the eighth via hole.

According to first aspect of the present disclose, it is provided a display device, comprising the aforementioned display panel.

According to first aspect of the present disclose, it is provided a manufacturing method of a display panel, comprising:

providing a base substrate, the base substrate comprising a display region and a non-display region located at a periphery of the display region, and the display region comprising at least one rounded corner;

forming a gate drive circuit in the non-display region; and forming a plurality of the first dummy pixels outside the at least one rounded corner of the display region, a first power line of each of the plurality of the first dummy pixels is connected with a high-level signal line of the gate drive circuit.

For example, manufacturing method further comprises: forming a plurality of pixel units in the display region, each of the plurality of pixel units being configured to emit light and each of the plurality of the first dummy pixels being configured to not emit light.

For example, the forming the plurality of the first dummy pixels comprises:

sequentially forming a buffer layer and an active layer on the base substrate;

forming a first scanning line, a second scanning line, a third scanning line, and a first gate electrode on the active layer;

forming a second insulation layer;

forming an initial voltage line and a second gate electrode on the second insulation layer;

forming a third insulation layer, wherein the third insulation layer overlays the initial voltage line and the second gate electrode, and the third insulation layer is provided with a plurality of via holes, and the plurality of via holes comprise a first via hole, a second via hole, a third via hole, a fourth via hole, a fifth via hole, a sixth via hole, and a seventh via hole; each of the first via hole, the second via hole, and the third via hole exposes the second gate electrode; each of the fifth via hole and the sixth via hole exposes the active layer; and the seventh via hole exposes the initial voltage line;

forming a data line, a power line, a connecting line and a drain electrode on the third insulation layer, wherein one terminal of the drain electrode is connected with the second gate electrode through the first via hole, the other terminal of the drain electrode is connected with the active layer through the fifth via hole; the data line is connected with the active layer through the fourth via hole; the power line is connected with the second gate electrode through the second via hole and the third via hole; one terminal of the connecting line is connected with the active layer through the sixth via hole, and the other terminal of the connecting line is connected with the initial voltage line through the seventh via hole;

forming a fourth insulation layer, the fourth insulation layer being provided with an eighth via hole, the eighth via hole exposing the drain electrode;

forming a pixel defining layer on the fourth insulation layer, the pixel defining layer defining a pixel opening, and the eighth via hole being located in the pixel opening; and forming an anode in the pixel opening, the anode being connected with the drain electrode through the eighth via hole.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

FIG. 3b is a cross-sectional view taken along line A-A in FIG. 3a;

FIG. 4b is a cross-sectional view taken along line A-A in FIG. 4a;

FIG. 5b is a cross-sectional view taken along line A-A in FIG. 5a;

FIG. 6b is a cross-sectional view taken along line A-A in FIG. 6a;

FIG. 7b is a cross-sectional view taken along line A-A in FIG. 7a;

FIG. 8b is a cross-sectional view taken along line A-A in FIG. 8a;

FIG. 9b is a cross-sectional view taken along line A-A in FIG. 9a;

DETAILED DESCRIPTION

Figure 1:
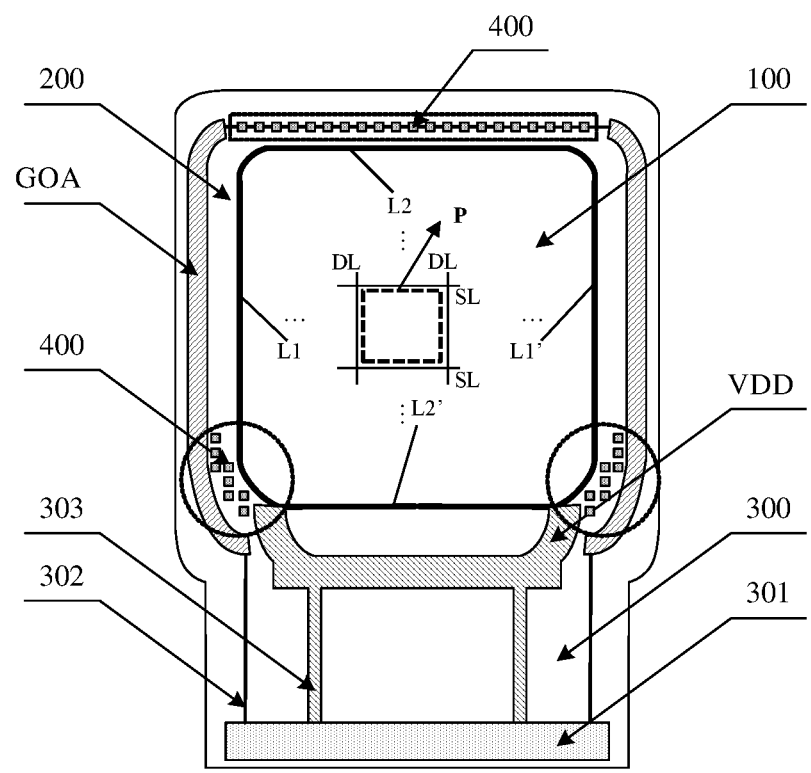
FIG. 1 is a schematic structural diagram of a display panel according to an embodiment of the present disclosure.

In order to make objectives, technical details and advantages of the embodiments of the present disclosure apparent, the technical solutions of the embodiments will be described in a clearly and fully understandable way in connection with the drawings related to the embodiments of the present disclosure. Apparently, the described embodiments are just a portion but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Similarly, the terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "on," "under," "left," "right" and the like are only used to indicate relative position relationship, and when the position of the described object is changed, the relative position relationship may be changed accordingly.

At present, the design of a rounded corner of an OLED display panel (that is, the corner of the panel is designed as the rounded corner, and this panel is referred to as an OLED special-shaped screen for short) is becoming more and more popular, in order to realize the concept of a comprehensive screen with uniform outer contour shape of the screen and electronic products. However, compared with an OLED rectangular screen, the existing OLED designed with rounded corner has problems of lower display quality, lower reliability, and lower detect-free ratio. Therefore, how to increase the display quality, the reliability, and the detect-free ratio of OLED is an urgent technical problem to be solved.

After making researches, inventors of the present disclosure found that the existing OLED special-shaped screen has the problems of lower display quality, lower reliability, and lower detect-free ratio, which are caused by the influence of the position of the rounded corner on etching uniformity. Specifically, because the position of the rounded corner is not conducive to the layout of the gate drive circuit and the pixel drive circuit, a large void region is left outside the rounded corner, which causes the etching uniformity of the pixel unit to deteriorate in the display region close to the rounded corner, and reduces the reliability and detect-free ratio. In addition, due to the deterioration of etching uniformity, the line width and the thickness of signal lines such as data lines, power lines, and gate lines are greatly deviated, which makes the resistance of signal lines deviate from the designed actual value, so that signal delay is prolonged, signal transmission speed and transmission capability is further affected, and the working stability of pixel drive circuit in display region is reduced, thereby resulting in lower display quality.

To solve at least one of the above problems, embodiments of the present disclosure provide a display panel. The display panel includes a display region and a non-display region located at a periphery of the display region, the display region includes at least one rounded corner, the non-display region includes a gate drive circuit and a plurality of dummy pixels, the plurality of dummy pixels are located outside the at least one rounded corner of the display region, and a first power line of each of the plurality of dummy pixels is connected with a high-level signal line of the gate drive circuit.

In the display panel provided by embodiments of the present disclosure, the plurality of dummy pixels are arranged in the non-display region and located outside the at least one rounded corner of the display region, so that the etching uniformity at the position of the at least one rounded corner is effectively increased. Moreover, the power line of each of the plurality of dummy pixels is connected with the high-level signal line of the gate drive circuit, so that the load of the gate drive circuit is reduced, the electrical performance of the pixel circuit in the display region is increased, and the problems of low display quality, low reliability, and low defect-free ratio of the existing OLED special-shaped screen are effectively solved.

The above-mentioned display panel may include an organic light-emitting diode (OLED) display panel, a quantum dot light-emitting diode (QLED) display panel, a micro light-emitting diode (Micro LED) display panel, etc, which are not limited in the present disclosure. In the following, the technical solution of the embodiments of the present disclosure will be explained in detail by taking the OLED display panel as an example.

FIG. 1 is a schematic structural diagram of a display panel according to an embodiment of the present disclosure. As illustrated in FIG. 1, the display panel of the present embodiment includes a display region 100, a non-display region 200 located at the periphery of the display region 100 (for example, surrounding the periphery of the display region 100), and a bonding region 300 located at one side of the display region 100. The display region 100 includes a first side edge L1 and a second side edge L2, and the first side edge L1 and the second side edge L2 are connected to each other through a rounded corner (or named as a chamfered rounded corner). For example, the display region 100 of the display panel of the present disclosure is provided with at least one rounded corner. The first side edge L1 and the second side edge L2 are connected to each other through a rounded corner, that is, the first side edge L1 transits to the second side edge L2 through an arc of the rounded corner. Further, in at least one example, the display region 100 includes a plurality of rounded corners. As illustrated in FIG.

1, the display region 100 includes a group of two opposite first side edges (L1 and L1') and a group of two opposite second side edges (L2 and L2'); and each of the two first side edges (L1 and L1') is connected with the two second side edges (L2 and L2') at two ends of the first side edge through the rounded corners, respectively. Under this case, the display region 100 includes four rounded corners. In other embodiments, the display region 100 includes a group of two opposite first side edges (L1 and L1') and a second side edge (L2); and the two first side edges (L1 and L1') are respectively connected with the second side edge (L2) at both ends of the second side edge (L2) through rounded corners. Under this case, the display region 100 includes two rounded corners. In the following description, the display region 100 including four rounded corners as illustrated in FIG. 1 is taken as an example for further explanation. As illustrated in FIG. 1, the display region 100 is provided with a plurality of gate lines SL and a plurality of data lines DL, which intersect with each other to form a plurality of pixel units P arranged in a matrix, and the plurality of pixel units P are configured to realize normal display. For example, the plurality of pixel units P at least include a first color pixel unit, a second color pixel unit, and a third color pixel unit. The first color, the second color, and the third color are three primary colors (for example, red, green, and blue).

As illustrated in FIG. 1, the non-display region 200 is located at the periphery of the display region 100, and the non-display region 200 is provided with a gate drive circuit, a power signal circuit VDD, and a plurality of dummy pixels 400. For example, the gate lines in the display region are connected with the gate drive circuit, and the gate drive circuit provides a drive voltage for the gate lines. In at least one example, in order to narrow the frame width of the display device and reduce the manufacturing cost, the gate drive circuit is arranged as a GOA circuit, that is, the gate drive circuit is directly integrated into the array substrate of the display panel. As illustrated in FIG. 1, the GOA circuits are located at two sides of the display region 100; a power signal circuit VDD is located at the lower side of the display region 100; and the plurality of dummy pixels 400 are respectively arranged outside the rounded corner in lower left of the display region 100 and outside the rounded corner in lower right of the display region 100, and located in the region between the GOA circuits and the display region 100. The plurality of dummy pixels 400 are configured to increase the etching uniformity at the position of the rounded corners and cannot emit light. In the present embodiment, the bonding region 300 is located at one side (for example, the lower side) of the display region 100 and includes a bonding pad 301. The GOA circuits are connected to the bonding pad 301 through a first lead 302, and the power signal circuit VDD is connected to the bonding pad 301 through a second lead 303.

Figure 15:
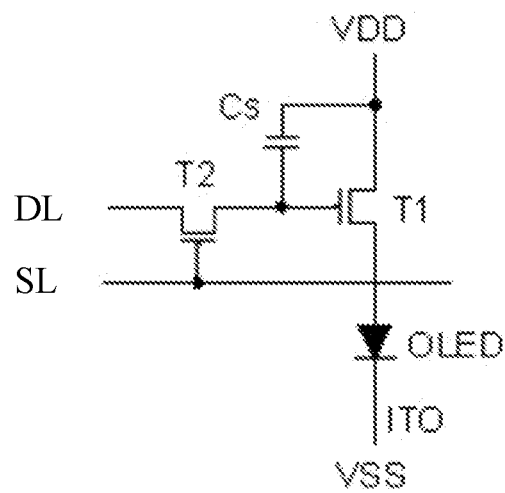
FIG. 15 is a block diagram of a pixel drive circuit according to an embodiment of the present disclosure.

In at least some embodiments, each of the plurality of dummy pixels 400 at least includes a pixel drive circuit. For example, as illustrated in FIG. 1, the plurality of dummy pixels 400 are different from the plurality of pixel units P of the display region 100 in that: the plurality of dummy pixels 400 are provided with only pixel drive circuits which have the same structure as the pixel drive circuits of the plurality of pixel units P, and no light-emitting unit is arranged in the plurality of dummy pixels 400, that is, the plurality of dummy pixels 400 cannot realize display function. Thus, the pixel drive circuits of the plurality of dummy pixels 400 are electrically connected to scanning lines, data lines, and the power lines, respectively, and the power lines are connected with high-level signal lines VGH of the GOA circuits. For example, as illustrated in FIG. 15, the pixel drive circuit of each of the plurality of pixel units P in the display region includes a drive unit and a light-emitting unit (such as an organic light-emitting diode OLED). The drive unit includes a transistor and a capacitor. In FIG. 15, the structure of the drive unit in the pixel drive circuit is only schematically illustrated by taking a 2T1C (a drive transistor T1, a switching transistor T2, and a storage capacitor Cst) as an example, but the embodiments of the present disclosure are not limited to this. In some embodiments, the drive unit also adopt 3T1C, 4T1C and other circuit structures. As illustrated in FIG. 15, the first electrode of the drive transistor T1 is connected with a power line VDD and the first electrode plate of the storage capacitor Cst, the second electrode of the drive transistor T1 is connected with the OLED, and the gate electrode of the drive transistor T1 is connected with a first electrode of the switch transistor T2 and the second electrode plate of the storage capacitor Cst. The gate electrode of the switching transistor T2 is connected with a scanning line SL, and the second electrode of the switching transistor T2 is connected with a data line DL. For example, the OLED includes a cathode and an anode, and a light-emitting functional layer located between the cathode and the anode. The light-emitting functional layer may include an organic light-emitting layer, a hole transport layer between the organic light-emitting layer and the anode, and an electron transport layer between the organic light-emitting layer and the cathode. It is contemplated that, in some embodiments, a hole injection layer may be further arranged between the hole transport layer and the anode, an electron injection layer may be further arranged between the electron transport layer and the cathode according to requirements, which is not limited in the present disclosure.

Figures 2A, 2B, 2C:
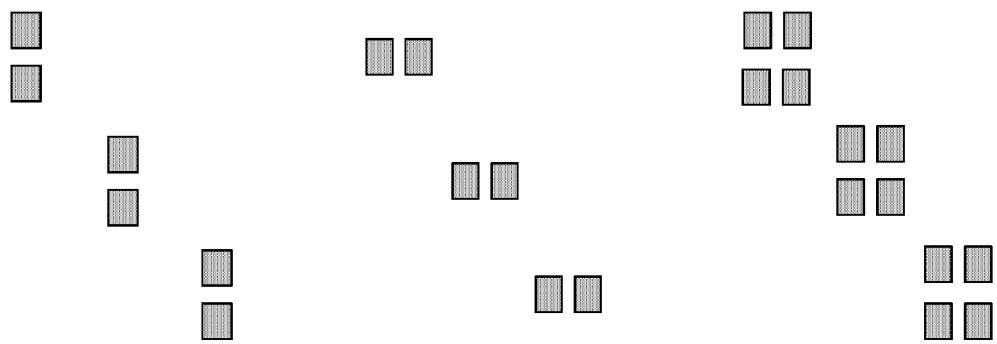
FIG. 2a to FIG. 2c are schematic structural diagrams of a plurality of dummy pixels having a step shape in embodiments of the present disclosure.

In at least some embodiments, a plurality of dummy pixels 400 outside the rounded corner in lower left of the display region 100 are located in the region between the GOA circuits and the display region 100, and the plurality of dummy pixels 400 are arranged as a step shape. Similarly, a plurality of dummy pixels 400 outside the rounded corner in the lower right of the display region 100 are located in the region between the GOA circuits and the display region 100, and the plurality of dummy pixels 400 are arranged as a step shape, so that the plurality of dummy pixels 400 are arranged in light of the trend arrangement of the rounded corners. In this way, the plurality of dummy pixels 400 arranged as a step shape include at least one column in the vertical direction. The plurality of dummy pixels 400 arranged as a step shape include at least one row in the horizontal direction. FIG. 2a, FIG. 2b, and FIG. 2c are schematic structural diagrams of a plurality of dummy pixels arranged as a step shape according to embodiments of the present disclosure. The plurality of dummy pixels 400 arranged as the step shape include six rows and three columns as illustrated in FIG. 2a; the plurality of dummy pixels 400 arranged as the step shape include three rows and six columns as illustrated in FIG. 2b, and the plurality of dummy pixels 400 arranged with the step shape include six rows and six columns as illustrated in FIG. 2c.

In at least some embodiments, a plurality of dummy pixels 400 are further arranged outside the side (upper side) of the display region 100 away from the bonding region 300, that is, the plurality of dummy pixels 400 are arranged in the non-display region 200 opposite to the bonding region 300, and the plurality of dummy pixels 400 are regularly arranged. The plurality of dummy pixels 400 regularly arranged include at least one column in the vertical direction. The plurality of dummy pixels 400 regularly arranged include at least one row in the horizontal direction.

In the display panel of the above embodiments, the plurality of dummy pixels arranged as the step shape are outside the rounded corners in lower left and lower right of the display region, so that the plurality of dummy pixels fill the region between the gate drive circuits and the display region according to the trend arrangement of the rounded corners, which solves the problems of uneven etching in the region of the rounded corners, increases the etching uniformity at the position of the rounded corners, and increases the reliability and defect-free ratio of the display panel. At the same time, the high-level signal line of the gate drive circuits is connected to the power line of the plurality of dummy pixel, so that the high-level signal lines are connected with the power lines of the plurality of dummy pixels in parallel manner, which reduces the resistance of the high-level signal lines, effectively reduces the load of the gate drive circuit, increases the working stability of the display panel, and reduces the power consumption.

Figure 3A:
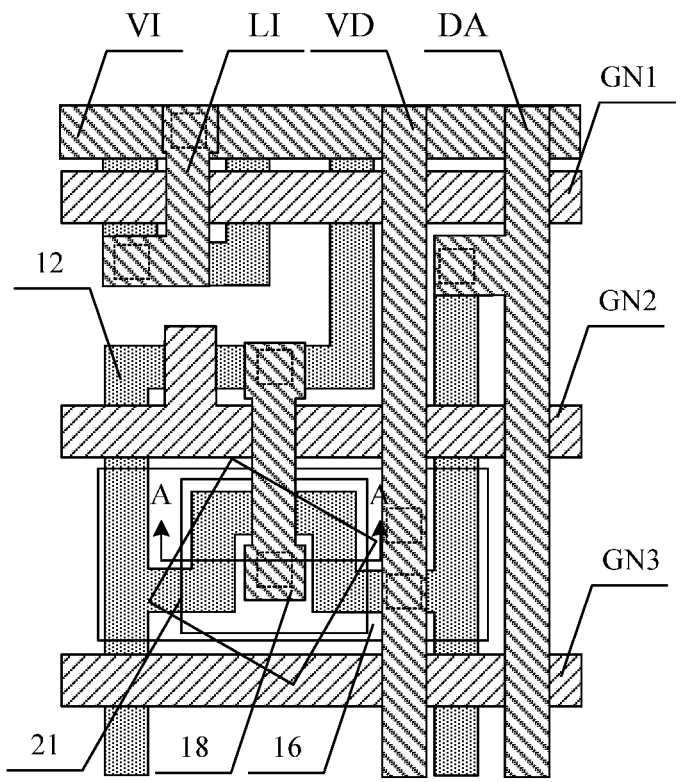
FIG. 3a is a schematic structural diagram of a plurality of dummy pixels in an embodiment of the present disclosure.
Figure 3B:
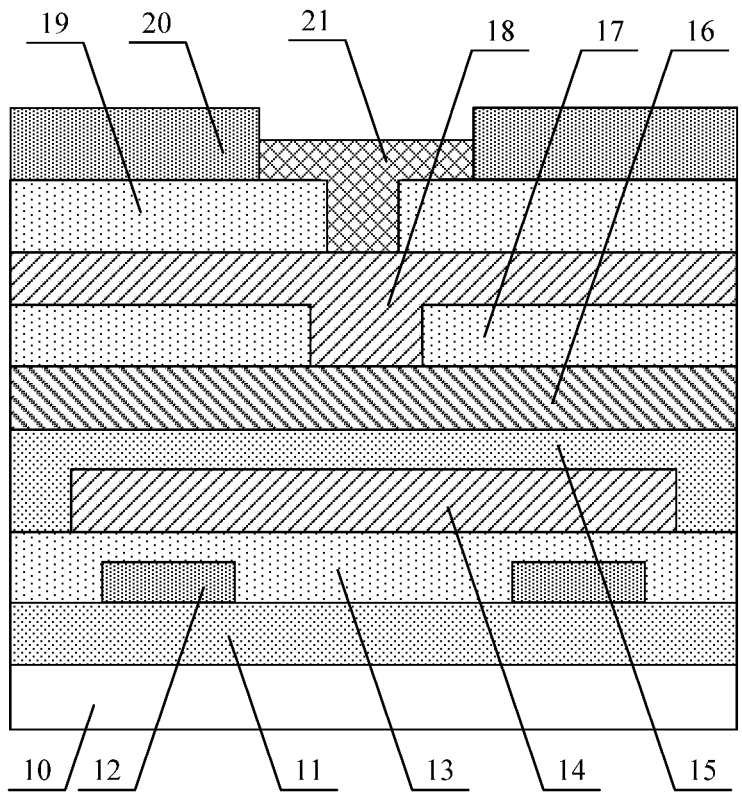

FIG. 3a is a schematic structural diagram of a plurality of dummy pixels in an embodiment of the present disclosure. FIG. 3b is a cross-sectional view taken along line A-A in FIG. 3a. As illustrated in FIG. 3a and FIG. 3b, each of the plurality of dummy pixels includes:

a base substrate 10;

a buffer layer 11, arranged on the base substrate 10;

an active layer 12, arranged on the buffer layer 11;

a first insulation layer 13, overlaying the active layer 12;

a first scanning line GN1, a second scanning line GN2, a third scanning line GN3, and a first gate electrode 14, all of which are arranged on the first insulation layer 13;

a second insulation layer 15, overlaying the first scanning line GN1, the second scanning line GN2, the third scanning line GN3, as well as the first gate electrode 14;

an initial voltage line VI and a second gate electrode 16, both of which are arranged on the second insulation layer 15;

a third insulation layer 17, overlaying the initial voltage line VI and the second gate electrode 16, the third insulation layer is provided with a plurality of via holes, and the plurality of via holes include a first via hole, a second via hole, a third via hole, a fourth via hole, a fifth via hole, a sixth via hole, and a seventh via hole; each of the first, second and third via holes exposes the second gate electrode 16, each of the fourth, fifth and sixth via holes exposes the active layer 12, and the seventh via hole exposes the initial voltage line VI;

a data line DA, a power line VD, a connecting line LI, and a drain electrode 18, all of which are arranged on the third insulation layer 17, one terminal of the drain electrode 18 is connected with the second gate electrode through the first via hole, the other terminal of the drain electrode 18 is connected with the active layer 12 through the fifth via hole; the data line DA is connected with the active layer 12 through the fourth via hole; the power line VD is connected with the second gate electrode 16 through the second via hole and the third via hole; one terminal of the connecting line LI is connected with the active layer 12 through the sixth via hole, and the other terminal of the connecting line LI is connected with the initial voltage line VI through the seventh via hole;

a fourth insulation layer 19, overlaying the data line DA, the power line VD, the connecting line LI, as well as the drain electrode 18, the fourth insulation layer 19 is provided with an eighth via hole exposing the drain electrode 18;

a pixel defining layer 20, arranged on the fourth insulation layer 19 and defining a pixel opening, the eighth via hole is located in the pixel opening; and an anode 21, arranged in the pixel opening and connected with the drain electrode 18 through the eighth via hole.

Figure 14:
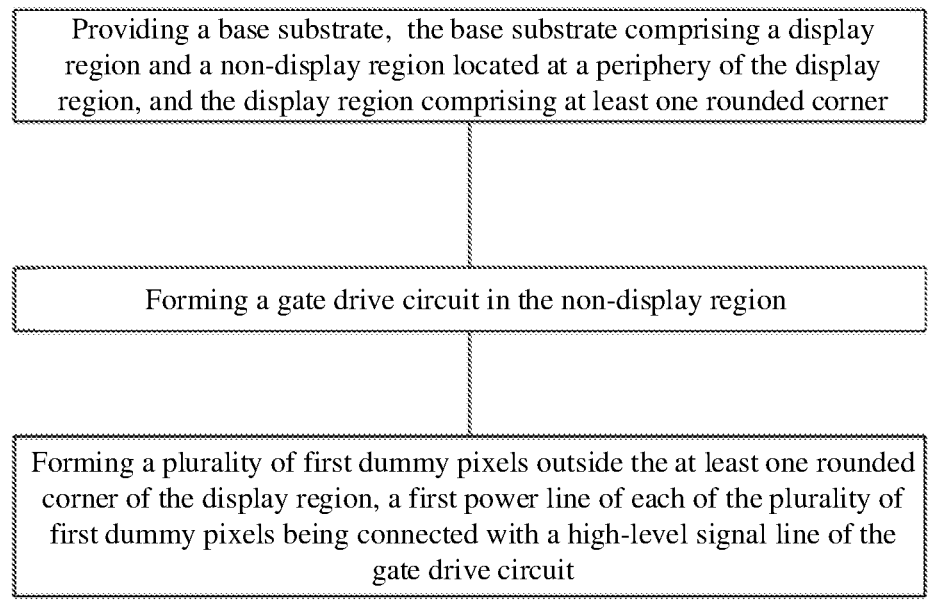
FIG. 14 is a flowchart of a manufacturing method of a display panel according to an embodiment of the present disclosure.

Referring to FIG. 1 and FIG. 14, an embodiment of the present disclosure further provides a manufacturing method of the above display panel, the method includes:

providing a base substrate, the base substrate includes a display region and a non-display region located at a periphery of the display region, and the display region includes at least one rounded corner;

forming a gate drive circuit in the non-display region; and forming a plurality of first dummy pixels outside the at least one rounded corner of the display region, a first power line of each of the plurality of first dummy pixels is connected with a high-level signal line of the gate drive circuit.

In manufacturing method of the display panel provided by the embodiment of the present disclosure, the plurality of dummy pixels are formed in the non-display region and the plurality of dummy pixels are located outside the rounded corners of the display region, so that the etching uniformity at the position of the rounded corners is effectively increased. Meanwhile, the power line of each of the plurality of dummy pixels is connected with the high-level signal line of the gate drive circuit, so that the load of the gate drive circuit is reduced, the electrical performance of the pixel circuit in the display region is increased, and the problems of low display quality, low reliability and low defect-free ratio of the existing OLED special-shaped screen are effectively solved.

In at least some embodiments, the above manufacturing method further includes:

forming a plurality of pixel units in the display region, each of the plurality of pixel units is configured to emit light and each of dummy pixels is configured to not emit light.

In at least some embodiments, the forming the plurality of first dummy pixels includes:

sequentially forming a buffer layer and an active layer on the base substrate;

forming a first scanning line, a second scanning line, a third scanning line, and a first gate electrode on the active layer;

forming a second insulation layer;

forming an initial voltage line and a second gate electrode on the second insulation layer;

forming a third insulation layer, the third insulation layer overlays the initial voltage line and the second gate electrode, the third insulation layer is provided with a plurality of via holes, and the plurality of via holes include a first via hole, a second via hole, a third via hole, a fourth via hole, a fifth via hole, a sixth via hole, and a seventh via hole; each of the first, second and third via holes exposes the second gate electrode, each of the fourth, fifth and sixth via holes exposes the active layer, and the seventh via hole exposes the initial voltage line;

forming a data line, a power line, a connecting line, and a drain electrode on the third insulation layer, one terminal of the drain electrode is connected with the second gate electrode through the first via hole, the other terminal of the drain electrode is connected with the active layer through the fifth via hole, the data line is connected with the active layer through the fourth via hole, the power line is connected with the second gate electrode through the second via hole and the third via hole, one terminal of the connecting line is connected with the active layer through the sixth via hole, and the other terminal of the connecting line is connected with the initial voltage line through the seventh via hole;

forming a fourth insulation layer, the fourth insulation layer is provided with an eighth via hole exposing the drain electrode;

forming a pixel defining layer on the fourth insulation layer, the pixel defining layer defines a pixel opening, and the eighth via hole is located in the pixel opening; and forming an anode in the pixel opening, the anode is connected with the drain electrode through the eighth via hole.

Next, the manufacturing method of the display panel will be further explained by examples. The "patterning process" mentioned in the present disclosure includes a film deposition process, a photoresist coating process, a mask exposure process, a development process, an etching process, a photoresist stripping process, or other treatment processes. The deposition process may adopt known methods such as sputtering, evaporation deposition, and chemical vapor deposition. The coating process may adopt known coating methods, and the etching may adopt known etching methods, which are not specifically limited here. In the description of the present disclosure, "film" refers to a film made from a certain material on a base substrate by the deposition process or other processes. If the "film" does not need a patterning process during the whole manufacturing method, the "film" may also be called as a "layer". If the "film" needs a patterning process during the whole manufacturing process, the "film" will be called as "film" before the patterning process and be called as "layer" after the patterning process. The "layer" after the patterning process contains at least one "pattern".

Figure 4A:
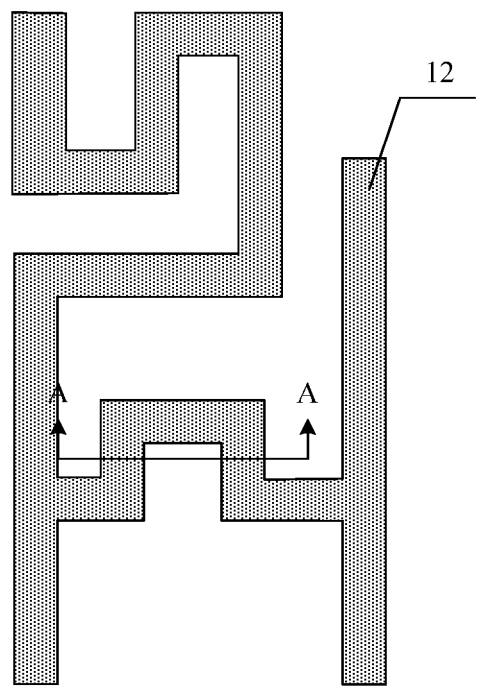
FIG. 4a is a schematic diagram of an embodiment of the present disclosure after forming an active layer pattern.
Figure 4B:
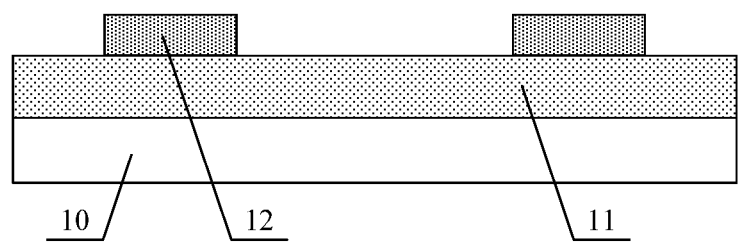

(1) Forming a pattern of buffer layer and a pattern of an active layer on the base substrate. For example, the forming the pattern of the buffer layer and the pattern of the active layer on the base substrate includes: sequentially depositing a buffer film and an active film on the base substrate 10, and patterning the active film by a patterning process to form the pattern of the buffer layer 11 overlaying the whole base substrate 10 and the pattern of the active layer 12 arranged on the buffer layer 11. As illustrated in FIG. 4a and FIG. 4b, FIG. 4b is a cross-sectional view taken along line A-A in FIG. 4a. The base substrate may be a flexible substrate, which is made from materials, such as polyimide (PI), polyethylene terephthalate (PET), or surface-treated polymer soft film, etc. The buffer film may be made from materials, such as silicon nitride (SiNx) or silicon oxide (SiOx), etc.; the buffer film may be a single layer, or may be a multi-layer structure made up of silicon nitride and silicon oxide. The active layer may be made from monocrystalline silicon, polycrystalline silicon, or oxide semiconductor materials.

Figure 5A:
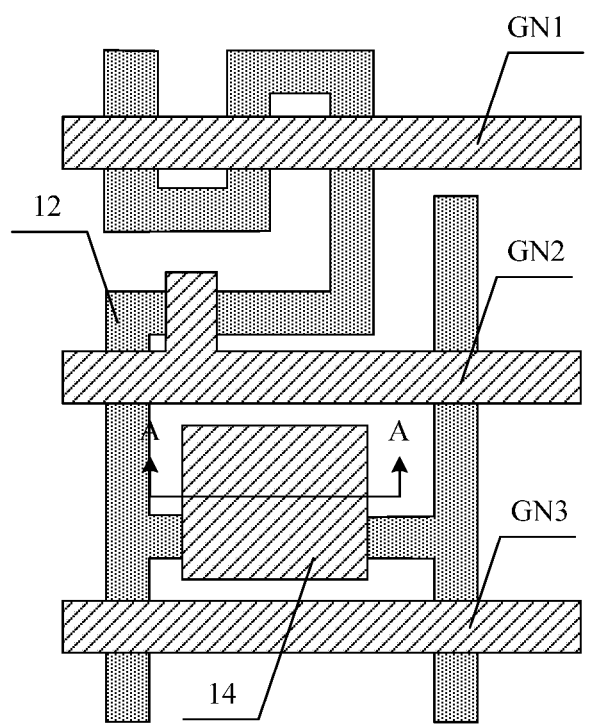
FIG. 5a is a schematic diagram of an embodiment of the present disclosure after forming a first gate electrode pattern.
Figure 5B:
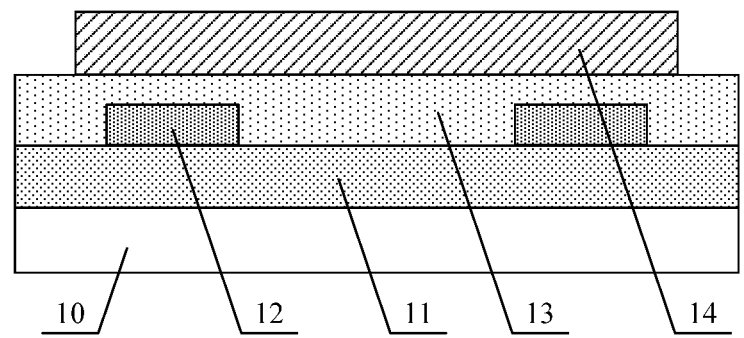

(2) Forming a pattern of a first scanning line, a second scanning line, a third scanning line, and a first gate electrode. For example, the forming the pattern of the first scanning line, the second scanning line, the third scanning line, and the first gate electrode pattern includes: sequentially depositing a first insulation film and a first metal film on the base substrate formed with the above structure, and patterning the first metal film by a patterning process to form the first insulation layer 13 overlaying both the active layer 12 and the buffer layer 11, and to form the pattern of the first scanning line GN1, the second scanning line GN2, the third scanning line GN3, and the first gate electrode 14 arranged on the first insulation layer 13. As illustrated in FIG. 5a and FIG. 5b, FIG. 5b is a cross-sectional view taken along line A-A in FIG. 5a.

Figure 6A:
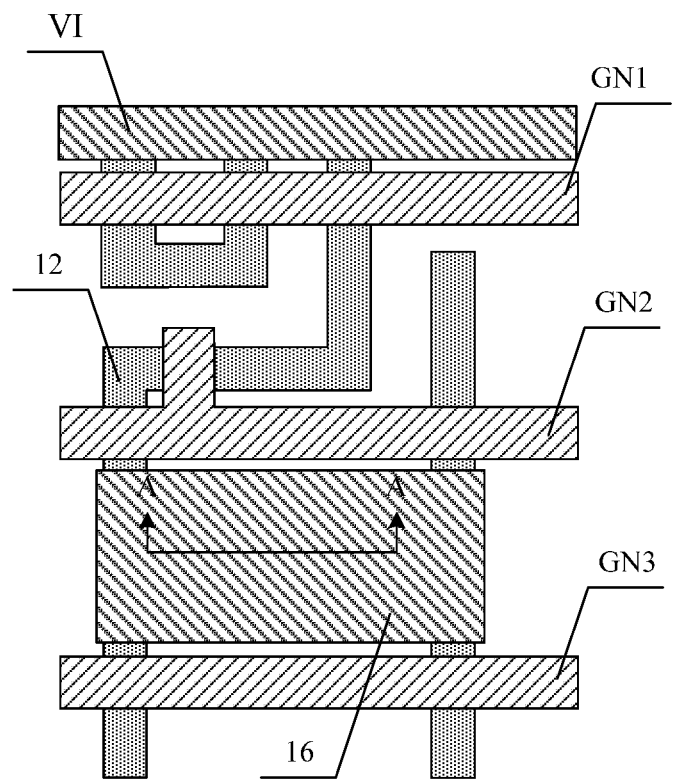
FIG. 6a is a schematic diagram of an embodiment of the present disclosure after forming a second gate electrode pattern.
Figure 6B:
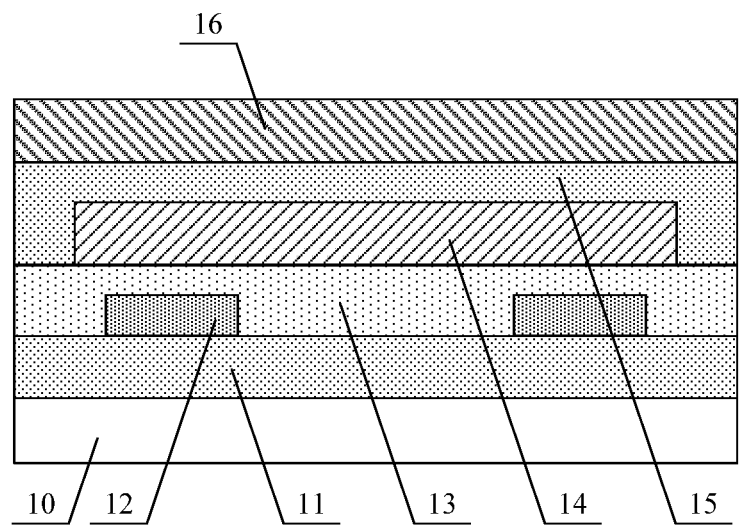

(3) Forming a pattern of an initial voltage line VI and a second gate electrode. For example, the forming the initial voltage line VI and the second gate electrode includes: sequentially depositing a second insulation film and a second metal film on the base substrate formed with the above structure, and patterning the second metal film by a patterning process to form the second insulation layer 15 overlaying the first scanning line GN1, the second scanning line GN2, the third scanning line GN3, and the first gate electrode 14, and to form the pattern of the initial voltage line VI and the second gate electrode 16 arranged on the second insulation layer 15. As illustrated in FIG. 6a and FIG. 6b, FIG. 6b is a cross-sectional view taken along line A-A in FIG. 6a.

Figure 7A:
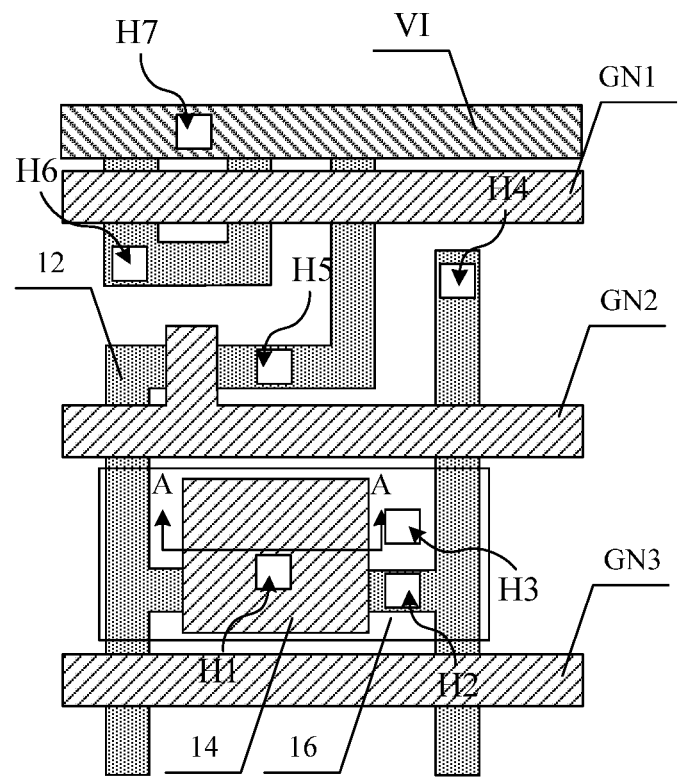
FIG. 7a is a schematic diagram of an embodiment of the present disclosure after forming a third insulation layer pattern.
Figure 7B:
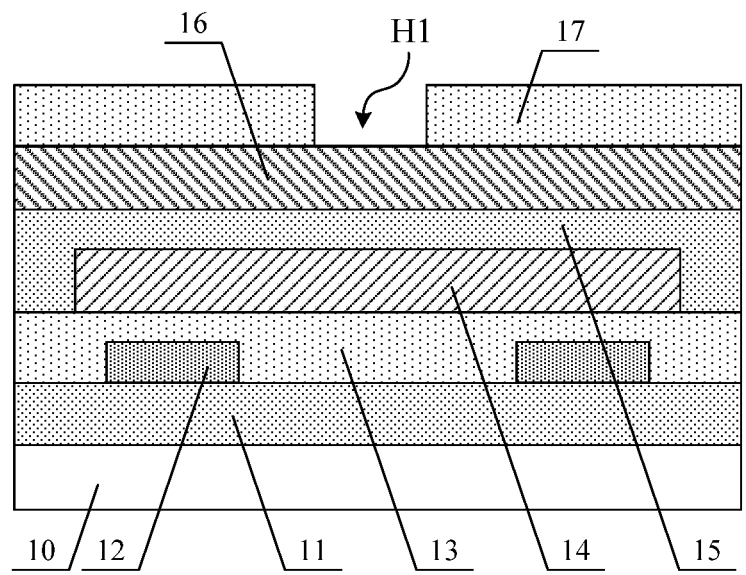

(4) Forming a pattern of a third insulation layer. For example, the forming the pattern of the third insulation layer includes: depositing a third insulation film on the base substrate formed with the above structure, and patterning the third insulation film by a patterning process to form a pattern of the third insulation layer 17 which is provided with a plurality of via holes, the plurality of via holes include a first via hole H1, a second via hole H2, a third via hole H3, a fourth via hole H4, a fifth via hole H5, a sixth via hole H6, and a seventh via hole; each of the first, second and third via holes H1, H2, H3 exposes the second gate electrode 16, each of the fourth, fifth and sixth via holes H4, H5, H6 exposes the active layer 12, and the seventh via hole H7 exposes the initial voltage line VI. As illustrated in FIG. 7a and FIG. 7b, FIG. 7b is a cross-sectional view taken along line A-A in FIG. 7a.

Figure 8A:
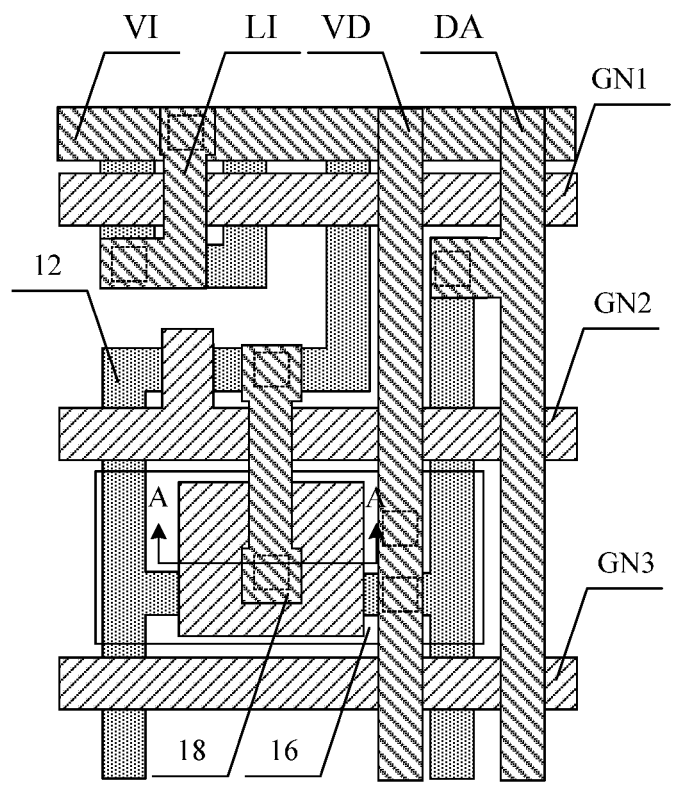
FIG. 8a is a schematic diagram of an embodiment of the present disclosure after forming a drain electrode pattern.
Figure 8B:
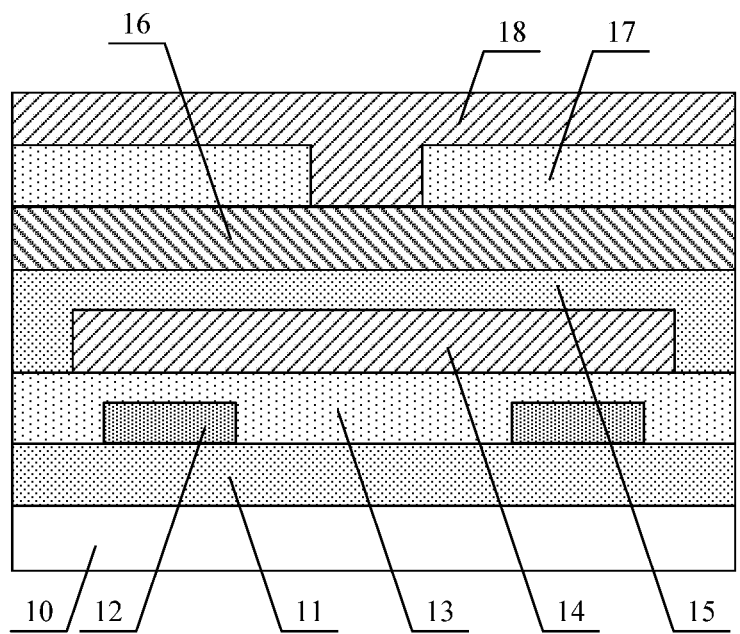

Forming a pattern of a data line, a power line, a connecting line, and a drain electrode. For example, the forming the pattern of the data line, the power line, the connecting line, and the drain electrode pattern includes: depositing a third metal film on the base substrate formed with the above structure, and patterning the third metal film by a patterning process to form the pattern of the data line DA, the power line VD, the connecting line LI, and the drain electrode 18 of the drive transistor. For example, one terminal of the drain electrode 18 is connected with the second gate electrode 16 through the first via hole H1, and the other terminal of the drain electrode 18 is connected with the active layer 12 through the fifth via hole H5. For example, the data line DA is connected with the active layer 12 through the fourth via hole H4. For example, the power line VD is connected with the second gate electrode 16 through the second via hole H2 and a third via hole H3. For example, one terminal of the connecting line LI is connected with the active layer 12 through the sixth via hole H6, and the other end of the connecting line LI is connected with an initial voltage line VI through the seventh via hole H7. As illustrated in FIG. 8a and FIG. 8b, FIG. 8b a cross-sectional view taken along line A-A in FIG. 8a.

(6) Forming a pixel defining layer and a pattern of an anode. For example, the forming the pixel defining layer and the pattern of the anode includes: first, forming a fourth insulation layer 19 on the base substrate formed with the above structure, the fourth insulation layer 19 overlaying the data line DA, the power line VD, the connecting line LI, and the drain electrode 18, and forming the pixel defining layer 20 on the fourth insulation layer 19. For example, the pixel defining layer 20 defines a pixel opening, and the fourth insulation layer 19 in the pixel opening is provided with an eighth via hole which exposes the drain electrode 18. Then, a transparent conductive film is deposited on the base substrate formed with the above pattern, and the transparent conductive film is patterned by a patterning process, so that a pattern of the anode 21 is formed in the pixel opening defined by the pixel defining layer 20; the anode 21 is connected with the drain electrode 18 through the eighth via hole, as illustrated in FIG. 3a and FIG. 3b. The pixel definition layer may be polyimide, acrylic, or polyethylene terephthalate, etc., and the transparent conductive film may be indium tin oxide (ITO) or indium zinc oxide (IZO), etc.

In at least some embodiments, the above structure of the plurality of dummy pixels and the plurality of pixel units in the display region are synchronously formed at the same time, and the structures and functions of the first scanning line, the second scanning line, the third scanning line, the initial voltage line, the data line, the power line, and the connecting line are the same as those of corresponding lines in the pixel drive circuit of the display region. The first insulation layer and the second insulation layer are also called as a gate insulation layer (GI), the third insulation layer is also called as an interlayer insulation layer (ILD), and the fourth insulation layer is also called as a planarization layer (PLN). In the present embodiment, each of the plurality of dummy pixels further includes a light-emitting unit. The OLED light-emitting unit in each of the plurality of pixel units includes a light-emitting layer formed on the anode. However, different from OLED light-emitting unit in each of the pixel units, no light-emitting layer is formed at the position where the plurality of dummy pixels are located, that is, the light-emitting unit in each of the dummy pixels includes only the anode and cathode, so that the plurality of dummy pixels will not emit light. As another embodiment, the plurality of dummy pixels include an anode, a cathode, and a light-emitting layer, but the anode is not electrically connected with the drain electrode, so the light-emitting layer also cannot emit light.

Figure 9A:
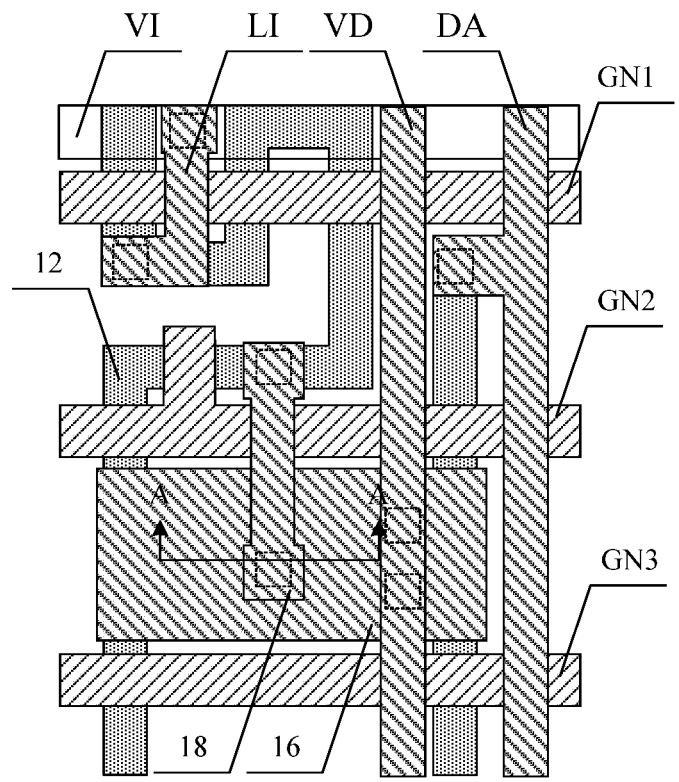
FIG. 9a is a schematic structural diagram of a plurality of dummy pixels in another embodiment of the present disclosure.
Figure 9B:
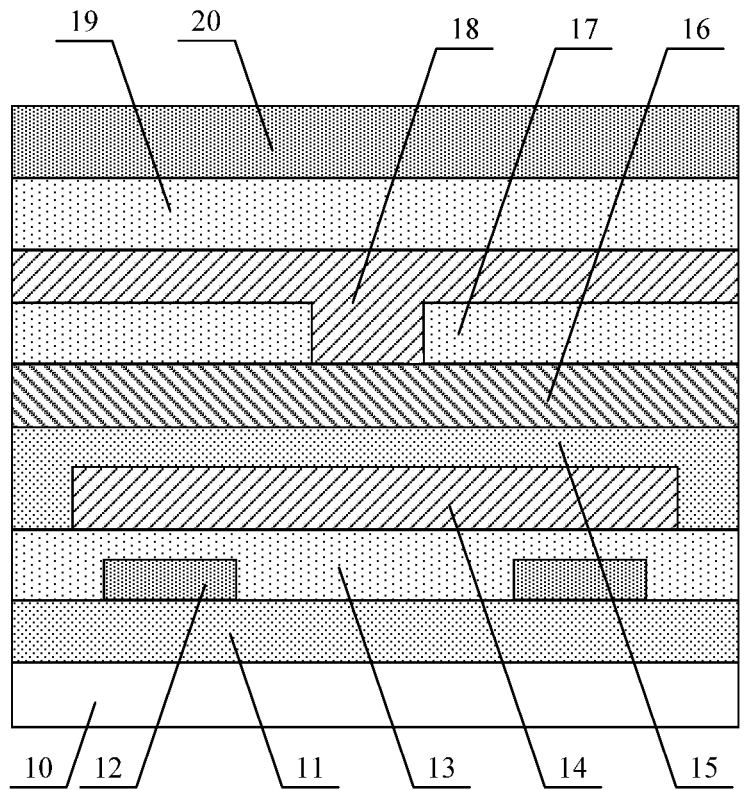

FIG. 9a is a schematic structural diagram of a plurality of dummy pixels in another embodiment of the present disclosure. FIG. 9b is a cross-sectional view taken along line A-A in FIG. 9a. As illustrated in FIG. 9b and FIG. 9b, the structure of the present embodiment is a variation of the plurality of dummy pixels as illustrated in FIG. 3a and FIG. 3b, which is different from the previous embodiment in that no pixel opening is formed in the pixel definition layer 20 of the dummy pixel, and no via hole is formed in the fourth insulation layer 19. In the present embodiment, while a anode, a light-emitting layer, and a cathode are formed sequentially in the pixel unit of the display region, the anode, the light-emitting layer, and the cathode may be further formed at the position where the dummy pixel is located, which can further increase the etching uniformity at the position of the rounded corners. However, the pixel drive circuit of the dummy pixel is not electrically connected with the light-emitting layer, that is, the anode of the dummy pixel is disconnected with the drain electrode of the dummy pixel and the drain electrode is electrically isolated from the anode, so the dummy pixel will not emit light.

It can be seen from the manufacturing process of the display panel in the present embodiment that the structure of the pixel drive circuit of the plurality of dummy pixels in the present embodiment is basically the same as that of the plurality of pixel units in the display region, which are formed synchronously. Thus, in the process of simultaneously forming the plurality of pixel units in the display region inside the rounded corners and the plurality of dummy pixels in the non-display region outside the rounded corners, the same film structure are simultaneously formed inside the rounded corners and outside the rounded corners at the same time, thus ensuring the continuity of the structures inside and outside the rounded corners, and effectively increasing the etching uniformity at the position of the rounded corners. Etching uniformity of the plurality of pixel units in the display region near the rounded corners ensures that the width and thickness of signal lines, such as data lines, power lines, and gate lines meet design values, and will not affect signal transmission speed and transmission capacity. At the same time, data lines of the plurality of dummy pixels are connected with data drive circuit, and power lines of the plurality of dummy pixels are connected with high-level signal lines of gate drive circuit, which is equivalent to connecting the power lines to high-level signal lines of gate drive circuit in parallel, thereby reducing resistance of the high-level signal lines, effectively reducing the load of gate drive circuit, and increasing working stability of pixel drive circuit in display region. Further, the first scanning line, the second scanning line, and the third scanning line of the plurality of dummy pixels can be set to be in a "suspended" state, that is, the first scanning line, the second scanning line, and the third scanning line of the plurality of dummy pixels are not electrically connected with any drive circuit, so as to prevent the pixel drive circuit of the plurality of dummy pixels from affecting the operation of the pixel drive circuit of the display region. In actual implementation, the first scanning line, the second scanning line, and the third scanning line of the plurality of dummy pixels may also be arranged to be connected with the output of the gate drive circuit; because the output of the gate drive circuit has a stable potential, the pixel drive circuit of the plurality of dummy pixels can play a role in increasing the electrical stability. Furthermore, because the times of the patterning process in the manufacturing method of the display panel provided by the embodiments of the present disclosure are basically the same as the times of the patterning process of the existing manufacturing methods, the implementation of the present disclosure does not need to change the existing manufacturing process flow and equipment, thus having good process compatibility, strong practicability, and good application prospect. To sum up, the display panel disclosed by the present disclosure effectively solves the problems of low display quality, low reliability and low defect-free ratio of the existing OLED special-shaped screen.

Figure 10:
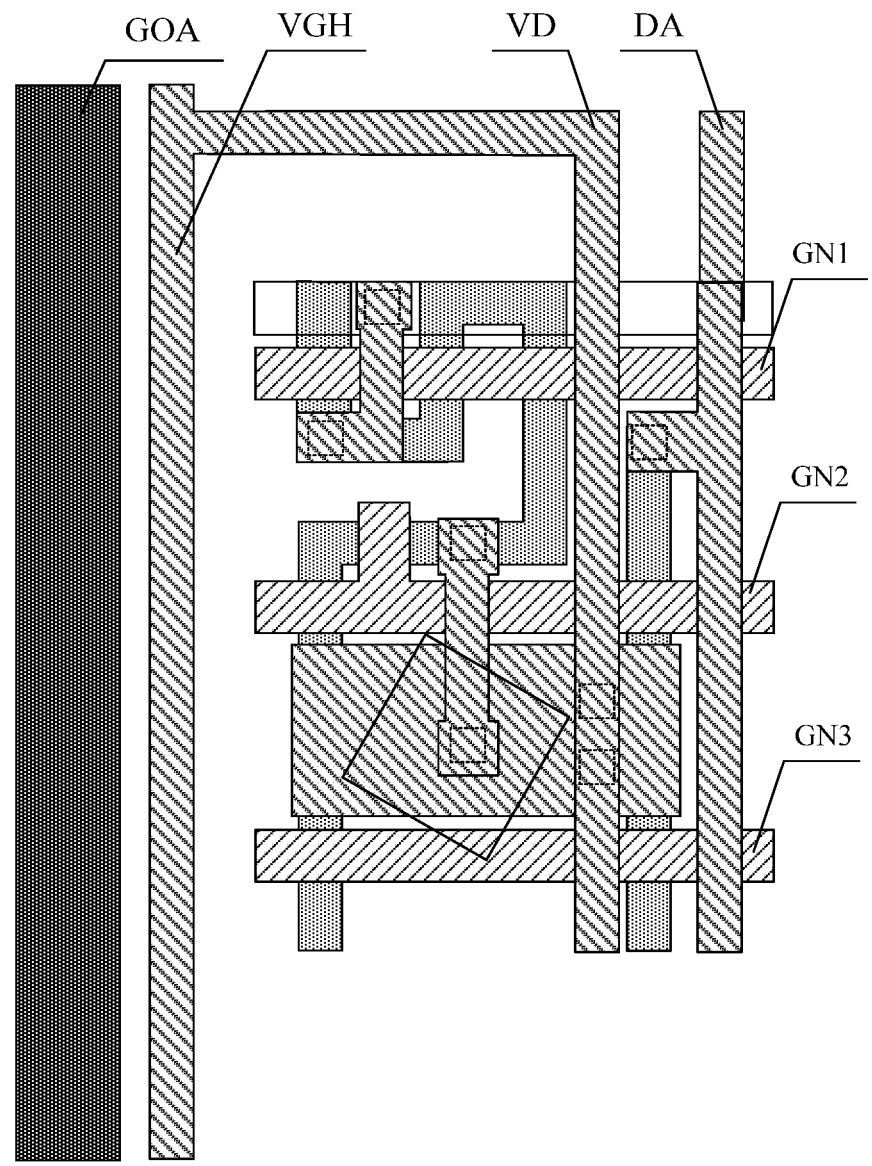
FIG. 10 is a schematic diagram of a power line connected with a high-level signal line according to an embodiment of the present disclosure.
Figure 11:
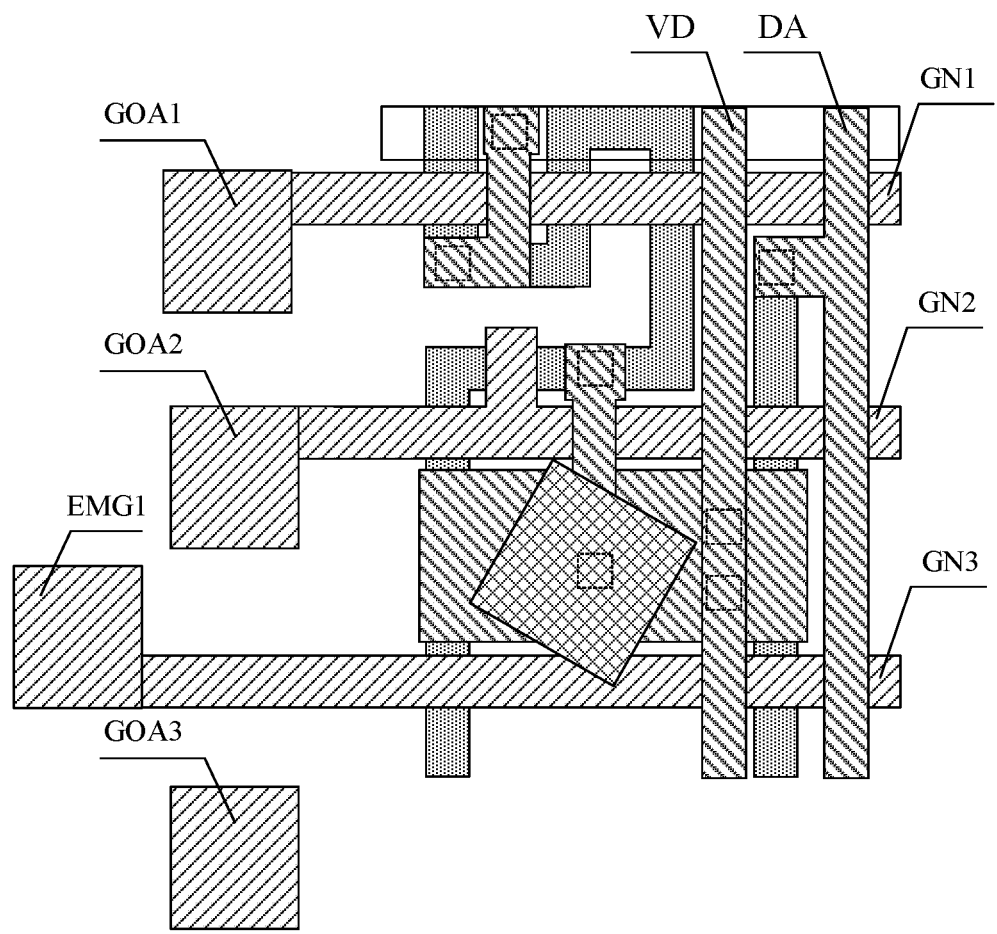
FIG. 11 is a schematic diagram of a scanning line connected with a gate drive circuit according to an embodiment of the present disclosure.

FIG. 10 is a schematic diagram of a power line connected with a high-level signal line according to an embodiment of the present disclosure. As illustrated in FIG. 10, because both the GOA circuit and the high-level signal line VGH are manufactured synchronously with the plurality of dummy pixels, the power line VD and the high-level signal line VGH, which are an integrated structure connected with each other, are formed at the same time of forming the data line DA and the power line VD during the same patterning process. FIG. 11 is a schematic diagram of a scanning line connected with a gate drive circuit according to an embodiment of the present disclosure. As illustrated in FIG. 11, in a specific embodiment, the first scanning line GN1 is connected with the first GOA unit (GOA1), the second scanning line GN2 is connected with the second GOA unit (GOA2), and the third scanning line GN3 is connected with the first control circuit EMG1, rather than connected with the third GOA unit (GOA3). In actual implementation, the above connections may be achieved through forming an interconnected integrated structure by using a single patterning process, or may be realized through via holes.

Figure 12:
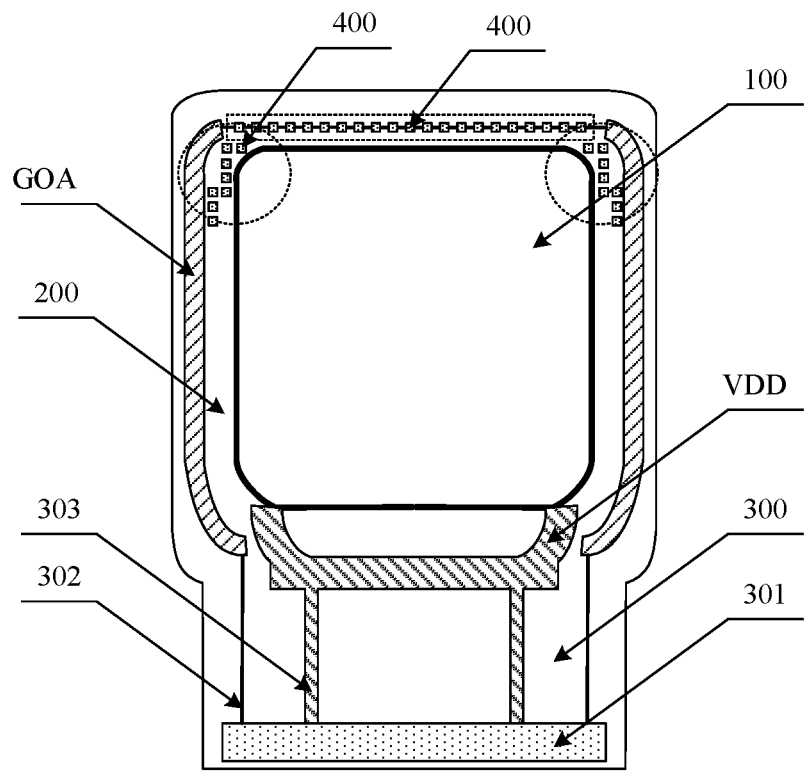
FIG. 12 is a schematic structural diagram of a display panel according to another embodiment of the present disclosure.

FIG. 12 is a schematic structural diagram of a display panel according to another embodiment of the present disclosure. The present embodiment is a variation of the display panel of FIG. 1, and the structure of the display panel as illustrated in FIG. 12 is basically the same as the structure of the display panel of FIG. 1. The display panel of FIG. 12 includes a display region 100, a non-display region 200 located at the periphery of the display region 100, and a bonding region 300. Different from the display panel of FIG. 1, the plurality of dummy pixels 400 in the present embodiment are arranged outside the rounded corners in upper left and upper right of the display region 100 as illustrated in FIG. 12, and the plurality of dummy pixels 400 are located between the GOA circuits and the display region 100. Moreover, the plurality of dummy pixels 400 are arranged in the non-display region 200 opposite to the bonding region 300.

For example, the plurality of dummy pixels 400 arranged in the region between the GOA circuits and the display region 100 are arranged as a step shape. Further, in at least one example, the plurality of dummy pixels 400 having the step shape includes at least one column in the vertical direction, and the plurality of dummy pixels 400 having the step shape includes at least one row in the horizontal direction. The plurality of dummy pixels 400 arranged at the opposite side of the bonding region 300 are distributed regularly, for example, the plurality of dummy pixels 400 are arranged at equal intervals, which is beneficial to reducing the manufacturing difficulty. In at least one example, the plurality of dummy pixels 400 regularly arranged include at least one column in the vertical direction, and the plurality of dummy pixels 400 regularly arranged include at least one row in the horizontal direction.

The present embodiment also achieves the technical effects of the aforementioned embodiment of FIG. 1, including: increasing the etching uniformity at the position of the rounder corners, reducing the load of the gate drive circuit, and increasing the electrical stability.

Figure 13:
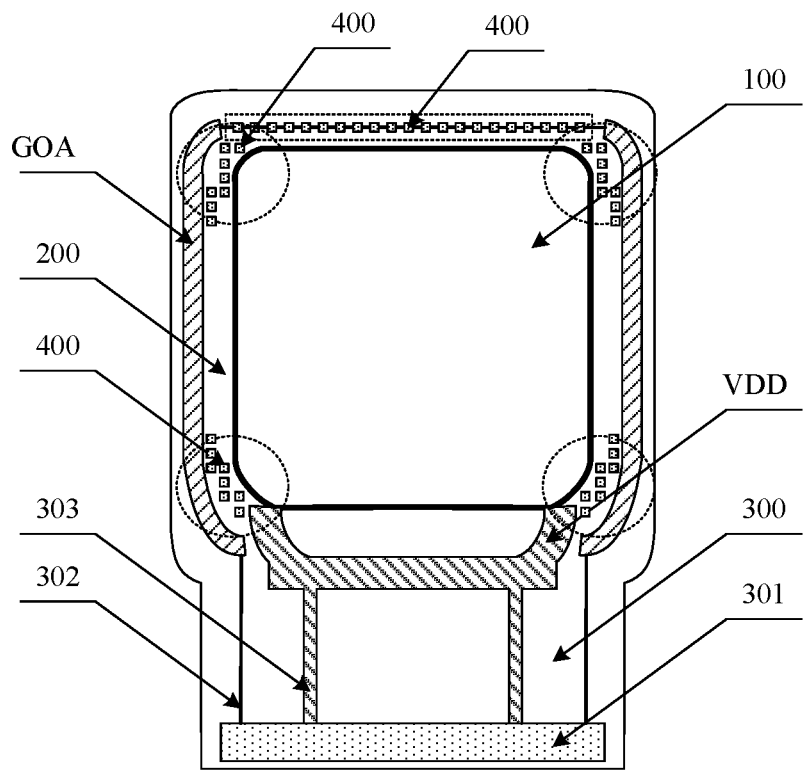
FIG. 13 is a schematic structural diagram of a display panel according to still another embodiment of the present disclosure.

FIG. 13 is a schematic structural diagram of a display panel according to still another embodiment of the present disclosure. The present embodiment is a variation of the embodiment of FIG. 1, and the structure of the display panel of FIG. 13 is basically the same as the structure of the display panel of the aforementioned embodiment. The display panel of FIG. 13 includes a display region 100, a non-display region 200 located at the periphery of the display region 100, and a bonding region 300. Different from the embodiment of FIG. 1, the plurality of dummy pixels 400 in the present embodiment as illustrated in FIG. 13 are arranged outside the four rounded corners of the display region 100, i.e., the rounder corner in upper left, the rounded corner in upper right, the rounder corner in lower left, and the rounder corner in lower right; and the plurality of dummy pixels 400 are located between the GOA circuits and the display region 100. Furthermore, the plurality of dummy pixels 400 are arranged in the non-display region 200 opposite to the bonding region 300.

For example, the plurality of dummy pixels 400 arranged in the region between the GOA circuits and the display region 100 are arranged as a step shape. In at least one example, the plurality of dummy pixels 400 having the step shape includes at least one column in the vertical direction, and the plurality of dummy pixels 400 having the step shape includes at least one row in the horizontal direction. The plurality of dummy pixels 400 arranged on the opposite side of the bonding region 300 are arranged regularly, for example, the plurality of dummy pixels 400 are arranged at equal intervals, which is beneficial to reducing the manufacturing difficulty. In at least one example, the plurality of dummy pixels 400 regularly arranged include at least one column in the vertical direction and at least one row in the horizontal direction.

The present embodiment also achieves the technical effects of the aforementioned embodiment of FIG. 1, including: increasing the etching uniformity of the position of the rounder corners, reducing the load of the gate drive circuit, and increasing the electrical stability.

Although the foregoing embodiments are described by taking the display region with four rounded corners as an example, the present disclosure is also applicable for the display region with only one rounded corner, only two rounded corners, only three rounded corners, or more than three rounded corners. For the display region with four rounded corners, the plurality of dummy pixels may also be arranged outside only one of the four rounded corners, or arranged outside three of the four rounded corners; alternatively, the plurality of dummy pixels may also be arranged outside the rounded corner in upper left and the rounded corner in lower left, or arranged outside the rounded corner in upper right and the rounded corner in lower right, or arranged outside the rounded corner in upper left and the rounded corner in lower right, or arranged outside the rounded corner in lower left and the rounded corner in upper right, etc.

The embodiment of the present disclosure further provides a display device, and the display device includes the aforementioned display panel in any one of the embodiments. The display device may be any product or component with display function, such as mobile phone, tablet computer, television, monitor, notebook computer, digital photo frame, navigator, etc. This display device has the technical effect of the aforementioned display panel, which will not be described in detail here.

In the disclosure, the following should be noted:

(1) The accompanying drawings involve only the structure(s) in connection with the embodiment(s) of the present disclosure, and other structure(s) can be referred to common design(s).

(2) For the purpose of clarity only, in accompanying drawings for illustrating the embodiment(s) of the present disclosure, the thickness and a size of a layer or area may be enlarged or narrowed, that is, the drawings are not drawn in a real scale.

(3) In case of no conflict, features in one embodiment or in different embodiments can be combined as a new embodiment.

What is described above is related to the illustrative embodiments of the disclosure only and not limitative to the scope of the disclosure; the scopes of the disclosure are defined by the accompanying claims.

What is claimed is:

1. A display panel, comprising:
   a display region, comprising at least one rounded corner; and
   a non-display region, located at a periphery of the display region, and the non-display region comprising:
   a gate drive circuit;
   a plurality of first dummy pixels, located outside the at least one rounded corner of the display region, a first power line of each of the plurality of the first dummy pixels being connected with a signal line of the gate drive circuit; and
   a plurality of second dummy pixels, provided at an opposite side of the display region to a bonding region, wherein each of the plurality of the first dummy pixels and each of the plurality of the second dummy pixels at least respectively comprises a pixel drive circuit, the pixel drive circuit comprises a first scanning line, a second scanning line, and a third scanning line, and wherein the first scanning line, the second scanning line, and the third scanning line are connected with the gate drive circuit respectively, or the first scanning line, the second scanning line, and the third scanning line are in a floating state.

2. The display panel according to claim 1, wherein each of the plurality of the first dummy pixels is located between the gate drive circuit and the display region, and each of the plurality of the first dummy pixels is configured to not emit light.

3. The display panel according to claim 2, wherein the plurality of the first dummy pixels are arranged as a step shape.

4. The display panel according to claim 2, wherein the bonding region is located at one of sides of the display region, the plurality of second dummy pixels are provided at an opposite side of the display region to the bonding region, and each of the plurality of the second dummy pixels is configured not to emit light.

5. The display panel according to claim 3, wherein the plurality of the first dummy pixels comprise at least one column in a first direction and at least one row in a second direction, and the first direction and the second direction are perpendicular to each other.

6. The display panel according to claim 3, wherein the bonding region is located at one of sides of the display region, the plurality of second dummy pixels are provided at an opposite side of the display region to the bonding region, and each of the plurality of the second dummy pixels is configured not to emit light.

7. The display panel according to claim 1, wherein the bonding region is located at one of sides of the display region, the plurality of second dummy pixels are provided at an opposite side of the display region to the bonding region, and each of the plurality of the second dummy pixels is configured not to emit light.

8. The display panel according to claim 7, wherein a second power line of each of the plurality of the second dummy pixels is connected with the signal line of the gate drive circuit.

9. The display panel according to claim 7, wherein the plurality of the second dummy pixels are arranged at equal intervals in at least one direction selected from the group consisting of a first direction and a second direction, and the first direction and the second direction are perpendicular to each other.

10. The display panel according to claim 9, wherein the plurality of the second dummy pixels comprise at least one column in the first direction and at least one row in the second direction.

11. The display panel according to claim 7, wherein the at least one rounded corner comprises:

a first rounded corner and a second rounded corner which are proximal to the bonding region, and the plurality of the first dummy pixels are arranged outside the first rounded corner and outside the second rounded corner.

12. The display panel according to claim 11, wherein the at least one rounded corner further comprises:

a third rounded corner and a fourth rounded corner which are distal to the bonding region, and the plurality of the first dummy pixels are arranged outside the third rounded corner and outside the fourth rounded corner.

13. The display panel according to claim 1, wherein each of the plurality of the first dummy pixels and each of the plurality of the second dummy pixels respectively further comprises a light-emitting unit, the pixel drive circuit comprises a drive transistor, the drive transistor comprises a drain electrode, and the light-emitting unit comprises an anode and does not comprise a light-emitting layer, the drain electrode of the drive transistor is electrically connected with the anode of the light-emitting unit.

14. The display panel according to claim 13, wherein each of the plurality of the first dummy pixels and each of the plurality of the second dummy pixels respectively further comprises:

a base substrate;
a buffer layer, provided on the base substrate;
an active layer, provided on the buffer layer;
a first insulation layer, overlaying the active layer;
the first scanning line, the second scanning line, the third scanning line, and a first gate electrode, all of which being provided in a same layer, the first scanning line, the second scanning line, the third scanning line, and the first gate electrode being provided on the first insulation layer;
a second insulation layer, overlaying the first scanning line, the second scanning line, the third scanning line, and the first gate electrode;
an initial voltage line and a second gate electrode, both of which being provided in a same layer, the initial voltage line and the second gate electrode are provided on the second insulation layer;
a third insulation layer, overlaying the initial voltage line and the second gate electrode, wherein the third insulation layer is provided with a plurality of via holes, and the plurality of via holes comprise a first via hole, a second via hole, a third via hole, a fourth via hole, a fifth via hole, a sixth via hole, and a seventh via hole; each of the first via hole, the second via hole, and the third via hole exposes the second gate electrode; each of the fifth via hole and the sixth via hole exposes the active layer; and the seventh via hole exposes the initial voltage line;
a data line, a power line, a connecting line, and the drain electrode, all of which are provided in a same layer, wherein the data line, the power line, the connecting line, the drain electrode are provided on the third insulation layer; one terminal of the drain electrode is connected with the second gate electrode through the first via hole, the other terminal of the drain electrode is connected with the active layer through the fifth via hole; the data line is connected with the active layer through the fourth via hole; the power line is connected with the second gate electrode through the second via hole and the third via hole; one terminal of the connecting line is connected with the active layer through the sixth via hole, and the other terminal of the connecting line is connected with the initial voltage line through the seventh via hole;
a fourth insulation layer, overlaying the data line, the power line, the connecting line, and the drain electrode, the fourth insulation layer being provided with an eighth via hole, the eighth via hole exposing the drain electrode;

a pixel defining layer, provided on the fourth insulation layer and defining a pixel opening, the eighth via hole being located in the pixel opening; and the anode, provided in the pixel opening and connected with the drain electrode through the eighth via hole.

15. The display panel according to claim 1, wherein each of the plurality of the first dummy pixels and each of the plurality of the second dummy pixels respectively further comprises a light-emitting unit, the pixel drive circuit comprises a drive transistor, the drive transistor comprises a drain electrode, and the light-emitting unit comprises an anode, a light-emitting layer, and a cathode, and the drain electrode of the drive transistor is electrically isolated from the anode of the light-emitting unit.

16. A display device, comprising: a display panel, the display panel comprising:

a display region, comprising at least one rounded corner; and a non-display region, located at a periphery of the display region, and the non-display region comprising:

a gate drive circuit;

a plurality of first dummy pixels, located outside the at least one rounded corner of the display region, a first power line of each of the plurality of the first dummy pixels being connected with a signal line of the gate drive circuit; and a plurality of second dummy pixels, provided at an opposite side of the display region to a bonding region, wherein each of the plurality of the first dummy pixels and each of the plurality of the second dummy pixels at least respectively comprises a pixel drive circuit, the pixel drive circuit comprises a first scanning line, a second scanning line, and a third scanning line, and wherein the first scanning line, the second scanning line, and the third scanning line are connected with the gate drive circuit respectively, or the first scanning line, the second scanning line, and the third scanning line are in a floating state.

17. A manufacturing method of a display panel, comprising:

providing a base substrate, the base substrate comprising a display region and a non-display region located at a periphery of the display region, and the display region comprising at least one rounded corner;

forming a gate drive circuit in the non-display region;

forming a plurality of the first dummy pixels outside the at least one rounded corner of the display region, a first power line of each of the plurality of the first dummy pixels is connected with a signal line of the gate drive circuit; and forming a plurality of second dummy pixels at an opposite side of the display region to a bonding region, wherein each of the plurality of the first dummy pixels and each of the plurality of the second dummy pixels at least respectively comprises a pixel drive circuit, the pixel drive circuit comprises a first scanning line, a second scanning line, and a third scanning line, and wherein the first scanning line, the second scanning line, and the third scanning line are connected with the gate drive circuit respectively, or the first scanning line, the second scanning line, and the third scanning line are in a floating state.

18. The manufacturing method according to claim 17, further comprising:

forming a plurality of pixel units in the display region, each of the plurality of pixel units being configured to emit light and each of the plurality of the first dummy pixels being configured to not emit light.

19. The manufacturing method according to claim 17, wherein the forming the plurality of the first dummy pixels comprises:

sequentially forming a buffer layer and an active layer on the base substrate;

forming a first scanning line, a second scanning line, a third scanning line, and a first gate electrode on the active layer;

forming a second insulation layer;

forming an initial voltage line and a second gate electrode on the second insulation layer;

forming a third insulation layer, wherein the third insulation layer overlays the initial voltage line and the second gate electrode, and the third insulation layer is provided with a plurality of via holes, and the plurality of via holes comprise a first via hole, a second via hole, a third via hole, a fourth via hole, a fifth via hole, a sixth via hole, and a seventh via hole; each of the first via hole, the second via hole, and the third via hole exposes the second gate electrode; each of the fifth via hole and the sixth via hole exposes the active layer; and the seventh via hole exposes the initial voltage line;

forming a data line, a power line, a connecting line and a drain electrode on the third insulation layer, wherein one terminal of the drain electrode is connected with the second gate electrode through the first via hole, the other terminal of the drain electrode is connected with the active layer through the fifth via hole; the data line is connected with the active layer through the fourth via hole; the power line is connected with the second gate electrode through the second via hole and the third via hole; one terminal of the connecting line is connected with the active layer through the sixth via hole, and the other terminal of the connecting line is connected with the initial voltage line through the seventh via hole;

forming a fourth insulation layer, the fourth insulation layer being provided with an eighth via hole, the eighth via hole exposing the drain electrode;

forming a pixel defining layer on the fourth insulation layer, the pixel defining layer defining a pixel opening, and the eighth via hole being located in the pixel opening; and forming an anode in the pixel opening, the anode being connected with the drain electrode through the eighth via hole.

* * * * *